(12) United States Patent
Heilmann

(10) Patent No.: US 9,774,828 B2
(45) Date of Patent: Sep. 26, 2017

(54) OPTICAL MEASUREMENT OF A COMPONENT HAVING STRUCTURAL FEATURES PRESENT AT OPPOSITE SIDES

(71) Applicant: ASM Assembly Systems GmbH & Co. KG, Munich (DE)

(72) Inventor: Norbert Heilmann, Munich (DE)

(73) Assignee: ASM ASSEMBLY SYSTEMS GMBH & CO. KG (DE)

( * ) Notice: Subject to any disclaimer, the term of this patent is extended or adjusted under 35 U.S.C. 154(b) by 383 days.

(21) Appl. No.: 14/616,815

(22) Filed: Feb. 9, 2015

(65) Prior Publication Data
US 2015/0237309 A1 Aug. 20, 2015

(30) Foreign Application Priority Data

Feb. 14, 2014 (DE) .......................... 10 2014 101 901

(51) Int. Cl.
*H04N 7/18* (2006.01)
*G06K 9/52* (2006.01)
*H04N 5/225* (2006.01)

(52) U.S. Cl.
CPC ................. *H04N 7/18* (2013.01); *G06K 9/52* (2013.01); *H04N 5/2258* (2013.01)

(58) Field of Classification Search
CPC ...... H04N 7/18; H04N 5/2258; G06T 7/0042; G06K 9/52
(Continued)

(56) References Cited

U.S. PATENT DOCUMENTS 5,245,421 A * 9/1993 Robertson ................ H04N 7/18
348/126
5,590,456 A 1/1997 Armington et al.
(Continued)

FOREIGN PATENT DOCUMENTS

DE    10249669 B3    6/2004
EP    1003212 A2    5/2000
(Continued)

*Primary Examiner* — Allen Wong
(74) *Attorney, Agent, or Firm* — Ostrolenk Faber LLP

(57) ABSTRACT

A method for mounting an electronic component (180) onto a component carrier (179) is described. The method comprises (a) optically capturing a first image from a first side of the component (180), at which first side a first structural feature (185) of the component (180) is discernible, by means of a first camera (120), (b) optically capturing a second image from a second side of the component (180), at which second side a second structural feature (186) of the component (180) is discernible, by means of a second camera (160), wherein the first side and the second side are situated opposite one another and wherein the second structural feature (186) is configured to be connected at a predetermined position on the component carrier (175), (c) orienting the electronic component (180) such that a center of the first structural feature (185) is aligned with a desired position relative to the component carrier (175), wherein the second structural feature (186) can be correspondingly offset from the predetermined position, and (d) mounting the electronic component (180) onto the component carrier (175), wherein the center of the first structural feature (185) is aligned relative to the component carrier (175), wherein the second structural feature (186) is offset from the predetermined position. Moreover, a method for checking the functionality of an optoelectronic component in advance of a population of a component carrier and an automatic
(Continued)

placement machine for mounting an optically measured electronic component are also described.

18 Claims, 4 Drawing Sheets

(58) Field of Classification Search
USPC .......................................................... 348/87
See application file for complete search history.

(56) References Cited

U.S. PATENT DOCUMENTS

| | | |
|---|---|---|
| 9,227,387 B2 | 1/2016 | Azuma et al. |
| 2002/0105656 A1* | 8/2002 | Nahum .................. G01B 11/14 356/614 |
| 2004/0163242 A1 | 8/2004 | Fukunaga |
| 2006/0209910 A1 | 9/2006 | Fukunaga |
| 2011/0293168 A1 | 12/2011 | Matsushima et al. |
| 2014/0332662 A1* | 11/2014 | Yoshida .................... G01J 1/32 250/205 |

FOREIGN PATENT DOCUMENTS

| | | |
|---|---|---|
| JP | 2013-077648 A | 4/2013 |
| JP | 2013-168683 A | 8/2013 |
| JP | 2015-119134 A | 6/2015 |
| WO | WO 2004/039139 A1 | 5/2004 |

\* cited by examiner

OPTICAL MEASUREMENT OF A COMPONENT HAVING STRUCTURAL FEATURES PRESENT AT OPPOSITE SIDES

TECHNICAL FIELD

The present invention relates to the technical field of the population of component carriers with electronic components. In particular the present invention relates to the optical measurement of electronic components in advance of a population. Specifically, the present invention relates to (i) a method for mounting an electronic component onto a component carrier with a previous measurement of the electronic component, (ii) a method for checking the functionality of an optoelectronic component in advance of the optoelectronic component being mounted on a component carrier and (iii) an automatic placement machine for mounting an optically measured electronic component.

BACKGROUND OF THE INVENTION

The use of light emitting diodes (LEDs) which are installed in headlights or luminaries that include a projection of the light via optical elements such as lenses or reflectors, or which are installed in sensors and have to be aligned highly accurately with a receiver, requires an alignment of the LEDs according to optical standpoints. While at present surface-mounted components, which also include the majority of LEDs, are aligned exclusively according to their geometrical center in order to place them positionally accurately, more and more nowadays there are applications in which the LEDs have to be aligned primarily according to the midpoint of their light emitting luminous area or of the incorporated LED chip.

In practice, however, there is typically an (undesired) offset between the geometrical center of an LED component, said geometrical center being determined in practice on the basis of the spatial position of the connection contacts such as connection areas or connection pins, and the light emitting luminous area. Such an offset can be between 0 and 100 μm ($100 \times 10^{-6}$).

In order that, however, rather than the geometrical center the midpoint of the light emitting area of a light emitting diode (LED) is accurately aligned with an optical axis of an optical arrangement or of an optoelectronic light receiving component, it is therefore necessary, in the course of an LED component being mounted on a component carrier, to measure the light emitting luminous area using an optical system and then to position and fix the LED component on the component carrier such that the midpoint of the light emitting luminous area of the relevant LED rather than the geometrical center of the LED component is located accurately on the placement position specified in a placement program of an automatic placement machine.

In order to approximately determine the spatial offset between the light emitting luminous area and the geometrical center of an LED component, it is known for the LED component to be measured either as early as in a feed unit used to feed the LED component to an automatic placement machine, or at a specific location within the automatic placement machine. The LED component is then collected by means of a pick-up tool, for example a suction pipette, such that the pick-up tool lands on the previously measured midpoint of the light emitting luminous area. The LED component is then placed onto a component carrier without a further position correction to a predefined desired position. What is problematic about this procedure is that a position correction can no longer be carried out for the LED component, which position correction would be necessary if the LED component is rotated somewhat or slips for example in the course of temporary placement, since then the previously performed position measurement of the light emitting luminous area is more or less useless. Moreover, in the extreme case, the offset between the luminous area and the electrical connection contacts could be so great that the LED component can no longer be soldered with the necessary quality in the case of a placement based on an ideal alignment according to the midpoint of the luminous area. In such a case, a placement with the relevant LED component should logically be prevented. However, this is not possible owing to the lack of information concerning the offset between the light emitting luminous area and the electrical connection contacts. Consequently, this results in a relatively low process reliability when populating component carriers with LED components.

SUMMARY OF THE INVENTION

The present invention is based on the object of improving the placement of electronic components with regard to an improved positioning of the structural features of the components on a populated component carrier.

This object is achieved by means of the subjects of the independent patent claims. Advantageous embodiments of the present invention are described in the dependent claims.

In accordance with a first aspect of the invention, a method for mounting an electronic component onto a component carrier is described. The method described comprises (a) optically capturing a first image from a first side of the component, at which first side a first structural feature of the component is discernible, by means of a first camera, (b) optically capturing a second image from a second side of the component, at which second side a second structural feature of the component is discernible, by means of a second camera, wherein the first side and the second side are situated opposite one another and wherein the second structural feature is configured to be connected at a predetermined position on the component carrier, (c) orienting the electronic component such that a center of the first structural feature is aligned with a desired position relative to the component carrier, wherein the second structural feature can be correspondingly offset from the predetermined position, and (d) mounting the electronic component onto the component carrier, wherein the center of the first structural feature is aligned relative to the component carrier, wherein the second structural feature is offset from the predetermined position.

The method described is based on the following insight: for an automatic placement of an electronic component on a component carrier by means of an automatic placement machine, a position measurement of the component is carried out in advance of or shortly before the placement. In this case, the component is held by a component holding device, for example a suction pipette. A possible offset and/or an angular position of the component in relation to the component holding device are/is determined in a known manner. This determination is effected on the basis of optically capturing the position of a first structural feature, for example of the electrical connections or the outer contour of the component. The spatial offset determined and/or the angular position determined are/is then compensated for during the placement of the component by means of a suitable adaptation of the position and/or the angular position of the component holding device during the process of placing the component onto a component carrier. If the two structural features have an unknown spatial offset with respect to one another, however, and, in the case of an assembly comprising the component carrier populated with the component, the spatial position of the second structural feature in relation to the component carrier is (also) of significance, however, then the spatial offset between the two structural features that is determined according to the invention can be taken into account in a suitable manner during the placement of the component.

In accordance with one exemplary embodiment of the invention, the method furthermore comprises measuring a spatial offset between the second structural feature and the first structural feature on the basis of the first image and the second image. In this case, in particular, the correct spatial position of the first structural feature can be determined.

When placing or positioning the component onto the component carrier to be populated, it is possible to take account of both (i) the offset between the first structural feature and the component holding device and/or the angular position of the component in relation to the component holding device and (ii) the spatial offset between the two structural features. Furthermore, as necessary, it is also possible to take account of a suitable compromise between the two aspects in need of compensation to a greater or lesser extent, said aspects being designated by (i) and (ii), during the placement of the component.

It is pointed out that before the electronic component is mounted or placed onto a component carrier, the component can, if appropriate, also be optically captured by an additional (third) camera in order to determine in a known manner the position and/or the orientation of the component picked up by a component holding device, for which component the spatial offset between the two structural features of the component is already known.

The described method according to the invention can be applied in an advantageous manner particularly if the two structural features can be optically captured in each case only from one direction, since they are covered by the body of the component from the other direction. This is because in this case, by means of optically capturing the first structural feature, for example, it is not possible to obtain information about the location at which the second structural feature is situated. The method described then constitutes not just at present the best but probably also the only possibility for determining the spatial offset between the two structural features embodied at opposite sides of the component.

In accordance with a further exemplary embodiment of the invention, the spatial offset is determined in a plane which is oriented parallel in relation to the first side and/or in relation to the second side. This has the advantage that the spatial offset can be determined particularly accurately. This holds true particularly if the two images are recorded in a direction which is perpendicular to the abovementioned plane.

The plane can preferably coincide with a principal plane of the electronic component to be measured. The principal plane can be provided for example by the surface of a semiconductor substrate contained in the component. Furthermore, alternatively or in combination, the principal plane can coincide with a surface of the housing of the component or be oriented parallel to said surface.

In accordance with a further exemplary embodiment of the invention, the first camera and the second camera have a fixed spatial relation with respect to one another. By means of a fixed spatial relation between the two cameras that is known as accurately as possible, the method described can be carried out with a high accuracy. In this case, it is not absolutely necessary for the fixed spatial relation between the two cameras to be permanently provided. Rather, it suffices if the relative spatial relation of the two cameras is known accurately at the point in time of the respective image recording and can then correspondingly be taken into account when determining the spatial offset.

In accordance with a further exemplary embodiment of the invention, a first optical axis of the first camera and a second optical axis of the second camera are aligned collinearly with respect to one another. In this case, the relative spatial arrangement of the two cameras with respect to one another can be realized with a particularly high accuracy. In this regard, for a highly accurate alignment of the two cameras, it is possible to use a method, for example, in which the cameras are directly opposite one another and in each case record an image of the other camera. Such a method for determining the relative spatial position between two cameras is described in DE 102 49 669 B3, for example. On the basis of the two recorded camera images, the position of at least one of the two cameras can then be readjusted such that the two cameras are aligned at least almost perfectly with respect to one another with regard to their optical axis.

It is pointed out that for a simple and at the same time also accurate spatial alignment of the two cameras, it is possible to use a specific glass component that is captured by both cameras. On the basis of markings situated on the glass component, the two cameras can then be aligned with high accuracy.

An at least almost perfect alignment of the two cameras can have the advantage, in particular, that the method described in this document can be performed with a high accuracy and the accuracy of an electronic assembly produced by means of placement is improved.

In accordance with a further exemplary embodiment of the invention, the first camera and/or the second camera are/is a camera movable within an automatic placement machine.

The movable camera can be moved for example within the automatic placement machine by means of a positioning or gantry system. Preferably, the movable camera can be fitted to a placement head of the automatic placement machine and be moved together with the placement head in or on the automatic placement machine to the position in which the corresponding image of the component is recorded. Between two successive image recordings of two different electronic components, the camera can then be brought to a different position in which it for example (i) captures the position and/or the location of a component relative to the holding device holding the component and/or (ii) captures the position of a component carrier to be populated which is introduced into a placement region of the automatic placement machine. The method described can thus be carried out with cameras of an automatic placement machine that already exist anyway. Yet conversion of an automatic placement machine in terms of apparatus is therefore not necessary, or is necessary only to a small extent, in order to perform the method described.

In accordance with a further exemplary embodiment of the invention, the component is situated in the same position during the capture of the first image and during the capture of the second image. This has the advantage that the method can be performed with a particularly high accuracy. An uncertainty with regard to a movement of the component between two different positions in which an image is in each case recorded can thus be avoided.

In accordance with a further exemplary embodiment of the invention, the first image and the second image are captured at different points in time. The two images are therefore captured successively with a specific temporal offset. This embodiment can be highly advantageous particularly if a brief illumination, for example a flash, is required for recording at least one image. In the case of temporally diverging image recordings, the image recording by one camera is then advantageously not disturbed by the flash for the other camera.

In accordance with a further exemplary embodiment of the invention, the first image and the second image are captured simultaneously. This has the advantage that the process of capturing the two images can be performed particularly rapidly. Thus, the entire method for optically measuring the structure of the electronic component can also be carried out more rapidly. In the case of a placement using an automatic placement machine for which the method described is performed, a higher placement performance can thus result, wherein the placement performance can be determined for example by the number of components which can be placed onto one or onto a plurality of component carriers within a predefined time, for example one second.

In accordance with a further exemplary embodiment of the invention, the component is situated in a first position during the capture of the first image and in a second position during the capture of the second image. The first position is different than the second position.

To put it illustratively, in accordance with the exemplary embodiment described here, the two images, respectively showing a structural feature situated at one side of the electronic component, are captured in different positions of the component. The electronic component therefore has to be moved between the first image recording and the second image recording. This is typically effected by means of a component holding device fitted to a placement head.

Particularly with the use of light sources for illuminating the component to be recorded, the image recording in different positions of the component has the advantage that the optical image recording by means of one camera cannot be disturbed by illumination assigned to the other camera.

A further advantage of the image recordings in different positions of the electronic component can consist in the fact that cameras which already exist anyway in an automatic placement machine and which are also used for other measurement and/or inspection tasks can be used for the method described here. Therefore, carrying out the method described here in or by means of a known automatic placement machine requires no or just a merely very low outlay in terms of apparatus with regard to a possibly required conversion of the automatic placement machine.

It is pointed out that carrying out the method described here, in which the two images of the component are recorded in different positions of the component, requires an accurate knowledge of the relative spatial location of the two positions. This means that the path along which the component is moved between the two positions must be known accurately. This naturally requires a high precision of corresponding positioning systems used to move a holding device for the component within an automatic placement machine.

In accordance with a further exemplary embodiment of the invention, the electronic component is situated on an optically transparent bearing element when at least one of the two images is optically captured.

The optically transparent bearing element can be a glass plate, for example, wherein the component is captured (i) by a camera situated below the glass plate by means of an optical transmitted-light configuration and (ii) by a camera situated above the glass plate by means of an optical reflected-light configuration.

Carrying out the method described here within a known automatic placement machine then merely necessitates, apart from the provision of two suitable cameras, an optically transparent bearing element on which the electronic component that is respectively to be captured is temporarily placed for the purpose of the recording of at least one of the two images.

In accordance with a further exemplary embodiment of the invention, the electronic component is held by a clamping device when at least one of the two images is optically captured.

The clamping device can be embodied in particular in such a way that the electronic component to be captured is held such that the image recording of the first and/or of the second image is not obstructed for example by a clamping jaw of the clamping device. In particular, the electronic component can be held laterally by the clamping device, such that the component can be captured from above by means of a first camera and from below by means of a second camera.

The use of such a clamping device, in comparison with the use of an optically transparent bearing element, has the advantage that no undesirable optical specular reflections can occur and, consequently, it is possible to achieve a problem-free image recording with a high quality of the resulting images of the component. The accuracy of the method described is increased as a result.

In this connection it is pointed out that in the case of optically capturing the component through an optically transparent bearing element, particularly in the case of reflected-light illumination of the component likewise through the optically transparent bearing element, specular reflections and/or instances of light scattering can regularly occur in practice, which are caused for example by contaminants on the optically transparent bearing element. In this connection it is easily understood that such specular reflections and/or instances of light scattering considerably impair the quality of the captured images. In practice, such contaminants are regularly caused by abrasion originating from components and/or the bearing element owing to handling of the components.

In this connection it is furthermore pointed out that reflected-light illumination can be very important in practice, since in many cases electronic connections situated at the underside of the relevant component can be optically captured reliably only by means of such illumination.

In accordance with a further exemplary embodiment of the invention, (a) a plurality of images of a plurality of components are recorded and thus optically captured by means of the first camera and/or by means of the second camera with a respective image recording, wherein an image is in each case assigned to a component, and (b) for each component of the plurality of components in each case a spatial offset between two structural features situated at or on different sides of the component is determined on the basis of the corresponding images of the component recorded from different directions. Furthermore, (c) each of the plurality of components is such that in each case a center of the first structural feature is aligned with a desired position relative to the component carrier, wherein the respective second structural feature can be correspondingly offset from the respective predetermined position, and (d) the plurality of components are mounted or placed onto the component carrier, wherein the center of the respective first structural feature is aligned relative to the component carrier, wherein the respective second structural feature is offset from the respective predetermined position.

To put it illustratively, this means that in advance of the population of a component carrier with a plurality of components, these components are not measured individually, but rather together with other components. In this way, the method described can be carried out particularly rapidly for a plurality of components, such that the placement performance of the respective automatic placement machine is correspondingly increased.

It is also possible for the plurality of components to be optically captured only by one of the two cameras by means of a single image recording (from one direction) and to be optically captured individually by means of the camera (from the other direction).

In accordance with a further exemplary embodiment of the invention, (a) the electronic component is an optoelectronic component, (b) the first structural feature is a light emitting chip of the optoelectronic component, and (c) the second structural feature is at least one electrical connection of the optoelectronic component.

In the exemplary embodiment mentioned here, therefore, the method described is used for optically measuring the structure of an optoelectronic component. A particularly large number of advantages are afforded at present for this application because in comparison with known methods for the first time it becomes possible to accurately position an optoelectronic component with regard to its optical characteristic, i.e. with regard to the position of the light emitting chip of the optoelectronic component. Specifically, in known methods, the optoelectronic components are spatially positioned only on the basis of the spatial position of their electrical connection contacts. An accurate positioning of an optoelectronic component on a component carrier in the optical sense is possible, however, only if a possible spatial offset of the light emitting luminous area provided by the light emitting chip in relation to the position of the electrical connection contacts of the optoelectronic component is known accurately. Exactly this spatial offset can be determined in a simple and efficient manner by means of the method described here and can be taken into account when placing or positioning the optoelectronic component.

Given knowledge of the spatial offset between the light emitting chip and the electrical connection contacts provided by the leadframe, the optoelectronic component can thus be accurately optically positioned on a component carrier. In this case, shortly before the placement, it is merely necessary to capture the spatial position of the electrical connection contacts of the optoelectronic component in a known manner. During the placement of the optoelectronic component on the component carrier, the spatial offset determined can then be taken into account in a suitable manner and compensated for by a changed positioning of the holding device holding the component.

The optoelectronic component can be a laser diode or a light emitting diode (LED), for example. Furthermore, the optoelectronic component can also be a light receiving component such as a photodiode, for example.

The method described here can be used advantageously in particular when populating component carriers with LEDs in automatic placement machines or else during the so-called die bonding of LEDs, since with known optical measurement methods during transport of LED components by means of suction pipettes it is not possible at any point in time to simultaneously record an image of the LED component from above (i.e. from the side with the light emitting luminous area) and from below (i.e. from the side with the electrical connection contacts). Therefore, for accurate placement in the optical sense, the use of the method described here is absolutely necessary in order to determine an unambiguous local relation between (i) the spatial position of the electrical connection contacts situated on the leadframe or directly on the light emitting chip and (ii) the spatial position of the light emitting luminous area. As already explained above, knowledge of said local relation is absolutely necessary in order to position the LED component on the populated component carrier optically accurately.

In accordance with a further exemplary embodiment of the invention, the first image is captured through a suction pipette.

This exemplary embodiment can be used advantageously in particular in the case of relatively large electronic components, since large electronic components are typically held by a relatively large suction pipette. A large suction pipette typically has a wide suction channel, into which an optical system optically coupled to the first camera, for example an optical waveguide, can be incorporated. The first structural feature of the component is then captured by means of said optical system. Thus, by way of example, the light emitting luminous area or the LED chip of an LED component can be optically captured, while the electrical connections of the LED component are measured at the same time. An intermediate step via an optical measuring station, in which the component is put on an optically transparent bearing area or is held by a clamping device, is thus advantageously not necessary.

In accordance with a further aspect of the invention a method for checking the functionality of an optoelectronic component is described. The checking method described comprises (a) determining a spatial offset between (i) a second structural feature of the optoelectronic component, which is situated at a second side of the component, and (ii) a first structural feature of the optoelectronic component, which is situated at a first side of the component, wherein the first side and the second side are situated opposite one another, by means of a sub-method for optically measuring the structure of the optoelectronic component. This sub-method comprises (a1) optically capturing a first image from the first side of the optoelectronic component by means of a first camera, (a2) optically capturing a second image form the second side of the component by means of a second camera, and (a3) determining the spatial offset on the basis of the first image and the second image, wherein the optoelectronic component is a light emitting optoelectronic component. The method furthermore comprises (b) contacting the light emitting optoelectronic component at an optically transparent carrier element, (c) switching on the light emitting optoelectronic component contacted at the optically transparent carrier element, (d) measuring the intensity of light which is emitted by the switched-on optoelectronic component, and (e) checking the functionality of the optoelectronic component on the basis of the measured intensity.

The described method for checking the functionality of an optoelectronic component is based on the insight that during the above-described method for mounting an electronic component onto a component carrier, the functionality of the optoelectronic component can also be checked. If it emerges here that the relevant optoelectronic component does not function or that the emitted light intensity is too high or, in particular, too low, then production of a defective electronic assembly can be prevented by virtue of the fact that the relevant optoelectronic component is not used for a placement process for producing the electronic assembly, but rather is rejected. The efficiency during production of electronic assemblies with optoelectronic components can be significantly increased in this way.

In accordance with one exemplary embodiment of the invention, the spatial distribution of the local luminance over a luminous area of the optoelectronic component is measured. The information about the distribution of the local luminance and in particular about the exact location on the luminous area where the luminance is highest can be used to align the component even more accurately within an optical device.

To put it illustratively, with the method described here, in the case of a light emitting optoelectronic component, it is possible to measure that location on the light emitting area or on the light emitting chip at which the intensity of the emitted light is maximal. In order, therefore, to obtain the best optical yield or the least optical attenuation in the case of an optical coupling between the light emitting optoelectronic component and an optical waveguide, for example, the light emitting optoelectronic component can be shifted by "active adjustment", i.e. when the light source is switched on, until the maximum quantity of light arrives at a receiver. That means that in the case of an LED, for example, use is not automatically made of the center of the chip or of the light emitting area for an "optical" adjustment. Rather, for the "optical" adjustment it is possible to use that location at which the chip or the light emitting area has the highest local luminance. An "optical" alignment of a light emitting optoelectronic component can thus be improved in an advantageous manner. This aspect of the invention is of importance for most LEDs because owing to fluctuations in the process for producing the LED chip, for example, the light emission is not distributed uniformly over the area of the chip and the geometrical center of the chip is therefore not the location having maximum light intensity.

In accordance with a further aspect of the invention, an automatic placement machine for mounting an electronic component onto a component carrier is described. The automatic placement machine described comprises (a) a placement head (i) for picking up the electronic component, (ii) for transporting the picked-up electronic component over the component carrier and (iii) for placing the transported electronic component onto the component carrier, (b) a first camera, (c) a second camera and (d) an evaluation device coupled to the two cameras, wherein the evaluation device is designed to cause the automatic placement machine to perform the above-described method for mounting an electronic component onto a component carrier.

It is pointed out that embodiments of the invention have been described with reference to different subjects of the invention. In particular, some embodiments of the invention are described with method claims and other embodiments of the invention with a device claim. However, it immediately becomes clear to the person skilled in the art upon reading this application that, unless explicitly indicated otherwise, in addition to a combination of features which are associated with one type of subject of the invention, any arbitrary combination of features which are associated with different types of subjects of the invention is also possible.

Further advantages and features of the present invention will become apparent from the following exemplary description of currently preferred embodiments. The individual figures in the drawing of this application should be regarded merely as schematic and as not true to scale.

DETAILED DESCRIPTION

It is pointed out that in the following detailed description features or component parts of different embodiments which are identical or at least functionally identical to the corresponding features or component parts of another embodiment are provided with the same reference signs or with a reference sign which differs from the reference sign of the identical or at least functionally identical features or component parts merely in the first digit. In order to avoid unnecessary repetition, features or component parts already explained on the basis of a previously described embodiment are not explained in detail at a later juncture.

Furthermore, it is pointed out that the embodiments described below merely constitute a limited choice of possible embodiment variants of the invention. In particular, it is possible to combine the features of individual embodiments with one another in a suitable manner, such that for the person skilled in the art, with the embodiment variants explicitly illustrated here, a multiplicity of different embodiments should be regarded as obviously disclosed.

As already described above, the method described in this document can be used for accurately ascertaining a production-dictated spatial offset within an LED component between (i) the LED chip or the light emitting area of the LED component (first structural feature) and (ii) the center of the electrical connections of the LED component (second structural feature). In this case, the LED component is optically captured simultaneously or in rapid succession from above and from below by two cameras accurately aligned with one another. Preferably, the LED component is not moved between the two camera recordings. The method can be carried out with components of any arbitrary size, as long as the features to be measured, i.e. the electrical connections or soldering connections and the LED chip, are within the field of view of the respective camera.

The individual steps for carrying out one exemplary embodiment of the method described in this document are described below with reference to FIGS. 1a to 1g. In accordance with the exemplary embodiment described here, the method is carried out in a placement system 100.

Figure 1A:
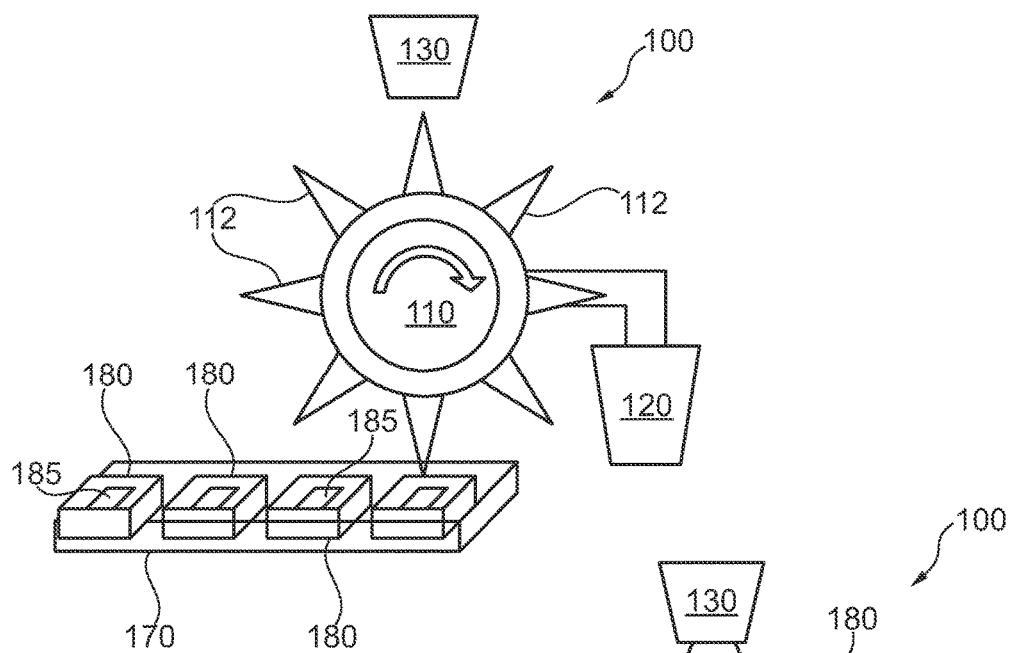
FIGS. 1a to 1g show a placement operation in which, before a component is placed onto a component carrier, the structure of the component is measured by means of an optical measuring method in accordance with one exemplary embodiment of the invention.

As is evident from FIG. 1a, an electronic LED component 180 is transferred by means of a feed unit (not illustrated) to a collection position from which it can be collected by a placement head 110 in a known manner. In accordance with the exemplary embodiment described here, the component feed is carried out by means of a feed belt 170, in which receptacle pockets (not provided with a reference sign) are formed, in each of which a component 180 is situated.

The LED component 180 comprises an LED chip 185, which is discernible only from above in FIG. 1*a*. In this document, the LED chip 185 is also designated as light emitting area or as first structural feature.

In accordance with the exemplary embodiment illustrated here, the placement head 110 is a so-called turret head which can rotate about a rotation axis oriented perpendicularly to the plane of the drawing. The direction of rotation in the clockwise direction is indicated by a curved arrow in FIG. 1*a*. It goes without saying that the illustrated direction of rotation is only by way of example and the placement head 110 can also rotate in the counterclockwise direction. The placement head 110 has a plurality of radially projecting component holding devices, which are embodied as so-called suction pipettes 112 in accordance with the exemplary embodiment illustrated here. As a result of a vacuum pressure being applied to the suction pipette 112, a component 180 can in each case be held at each suction pipette 112.

A first camera 120 is fitted to the placement head 110. Since said camera 120 is usually used for measuring markings fitted on a component carrier to be populated or a printed circuit board to be populated (not illustrated), said camera is often also designated as a printed circuit board camera 120. The accurate position of a printed circuit board to be populated which is introduced into a placement region of the placement system is determined in a known manner by the capture of such markings.

In accordance with the exemplary embodiment illustrated here, an optional further camera 130 is furthermore fitted to the placement head 110, the components 180 picked up by the holding devices 112 being captured by means of said further camera. Therefore, the further camera 130 is often also designated as a component camera. On the basis of component capture, it is possible to ascertain the angular position of the picked-up component 180 and also an offset possibly present between the center of the component 180 and the longitudinal axis of the respective suction pipette 112. When the component 180 is subsequently placed onto the printed circuit board, said angular position and also said offset are then compensated for in a known manner by means of a suitable rotation of the suction pipette 112 about the longitudinal axis thereof or by means of an adapted position of the placement head 110.

Figure 1B:
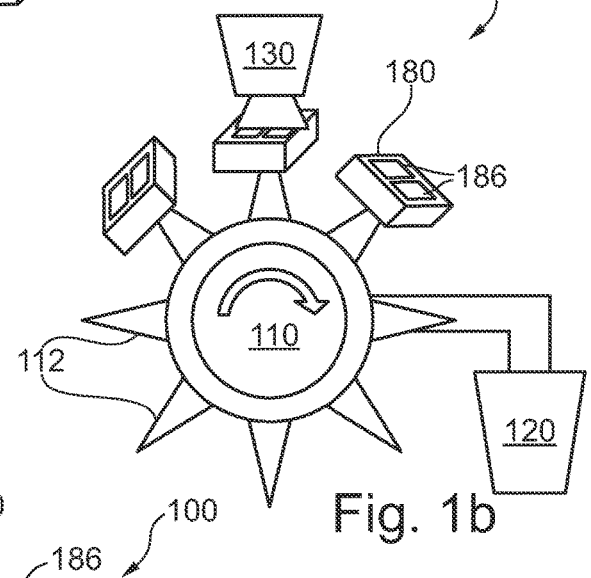

The optical measurement of a component 180 situated in the field of view of the component camera 130 is illustrated in FIG. 1*b*. This figure also reveals the component connections at the underside of the respective component 180. The component connections, which are also designated as second structural feature in this document, are provided with the reference sign 186.

Figure 1C:
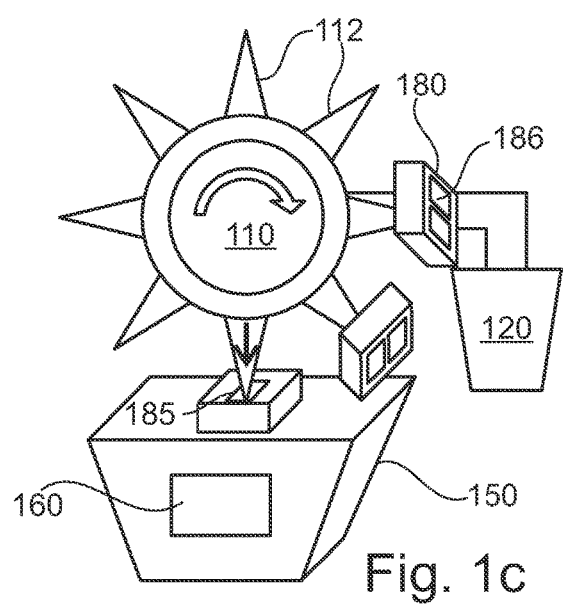

As described above, the component camera 130 is optional for carrying out the method described here. However, the component camera 130 may be of importance in order to determine the position of the component 180 to be measured at the suction pipette 112. The component 180 can thereby be prevented from being placed at an incorrect location, with the result that the component can be reliably captured from below by means of a camera 160 of a measuring station 150. The placing of the component 180 on the top side of the measuring station 150 is illustrated in FIG. 1*c*. The component 180 is placed by means of a downward movement of the corresponding suction pipette 112. This movement is illustrated by a straight arrow in FIG. 1*c*.

Figure 1D:
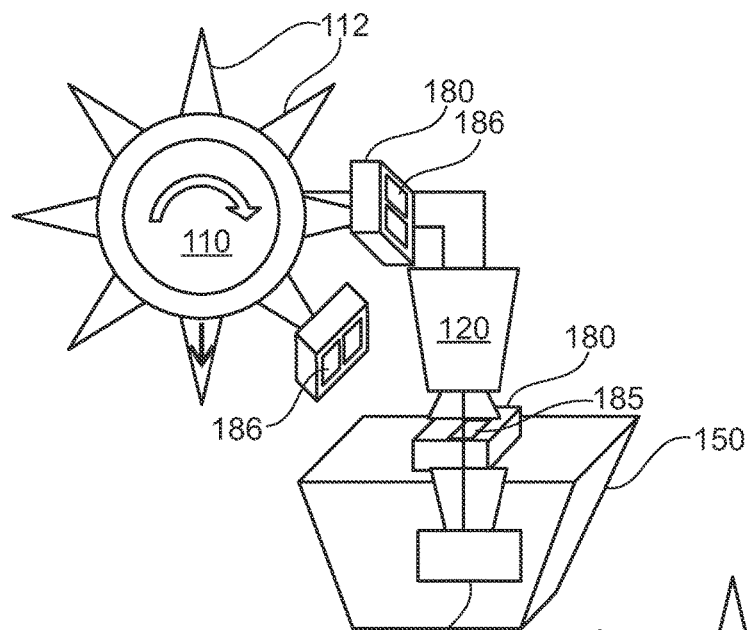

FIG. 1*d* illustrates the simultaneous measurement of the LED component 180 (*i*) by means of the camera 160, which is also designated as second camera 160 in this document, and (ii) by means of the printed circuit board camera 120, which is also designated as first camera 120 in this document. For this purpose, the placement head 110 was moved such that the printed circuit board camera 120 fitted thereto is situated exactly above the component 180 placed on the measuring station 150. On the basis of the two images recorded by the two cameras 120 and 160, a spatial offset between (i) the first structural feature or the LED chip 185 at the top side of the LED component 180 and (ii) the electrical component connections 186 embodied at the underside of the LED component 180 is then determined.

Figure 1E:
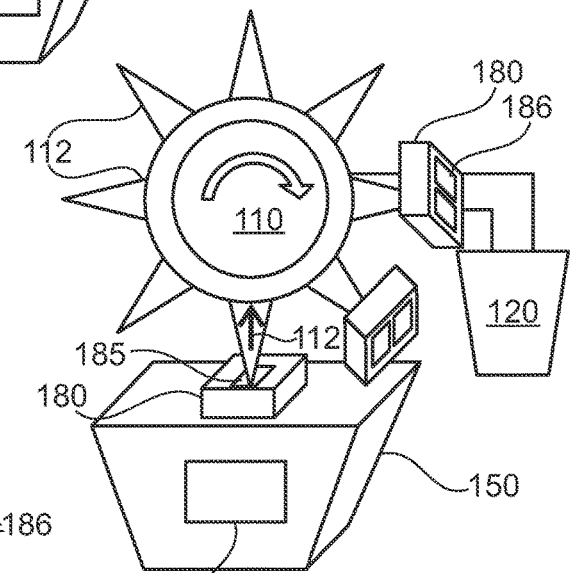

After both the top side and the underside of the component 180 have been captured simultaneously by the camera 120 and the camera 160, the component 180 is then collected from the measuring station 150. This is illustrated in FIG. 1*e*, in which the suction pipette 112 used to collect the component 180 is provided with a straight arrow directed upward. It is pointed out at this juncture that not all of the components which can be picked up by the plurality of suction pipettes 112 are illustrated in FIGS. 1*a* to 1*g*, for reasons of clarity. It goes without saying, however, that a plurality of components can be measured quasi-continuously by means of the method described here. It goes without saying that all of the suction pipettes 112 (eight in number by way of example in FIG. 1) can be used for this purpose.

Figure 1F:
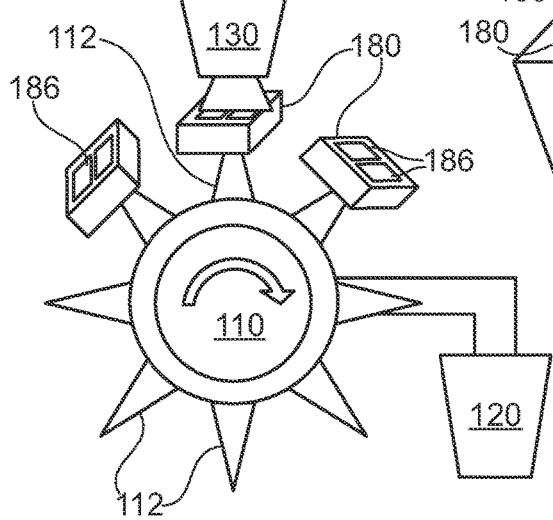

By means of a rotation of the placement head 110 along the direction of rotation represented by a curved arrow, the collected component 180 is then brought to a position in which it can be captured again by the component camera 130. This is illustrated in FIG. 1*f*. As already described above, the angular position of the component 180 and also an offset possibly present between the component 180 and the longitudinal axis of the corresponding suction pipette 112 are then measured by means of the component camera 130. Such renewed measurement of the component 180 by means of the camera 130 may be necessary particularly if the component 180 inadvertently slips or is rotated in the course of being placed on and/or picked up from the measuring station 150.

Figure 1G:
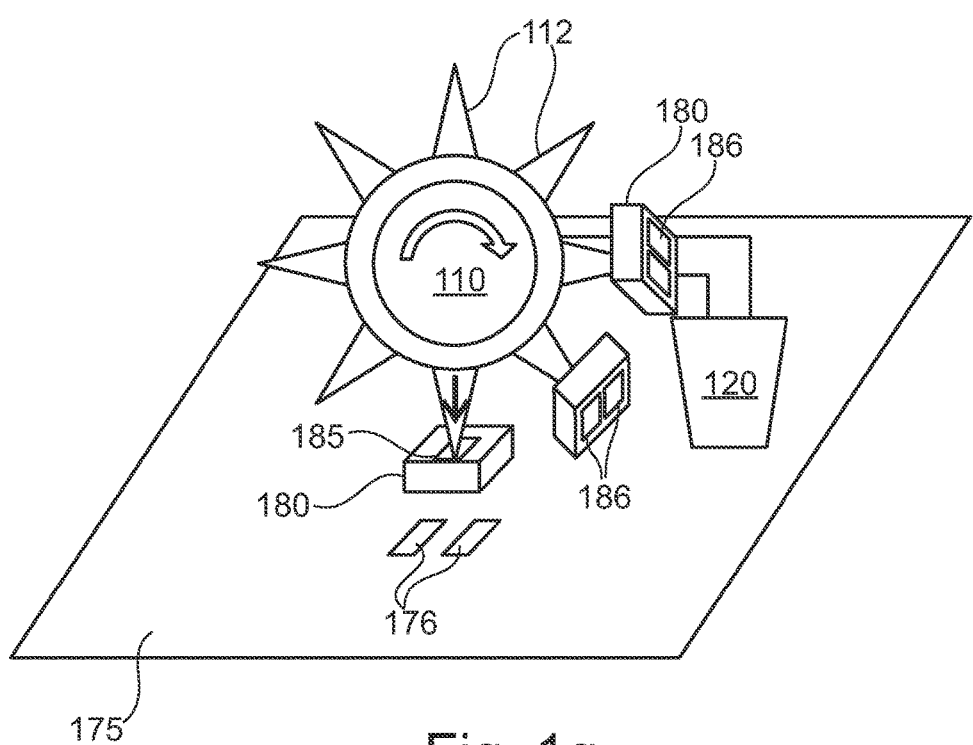

FIG. 1*g* shows the placement of the corresponding component 180 onto a component carrier or onto a printed circuit board 175. The printed circuit board 175 has connection pads 176, two of which are illustrated in FIG. 1*g*. During the placement of the component 180, which placement is indicated by a straight arrow directed downward in FIG. 1*g*, the previously ascertained angular position and/or an ascertained offset of the LED component 180 in relation to the longitudinal axis of the relevant suction pipette 112 are/is compensated for in a known manner by means of a rotation of the suction pipette 112 about the longitudinal axis thereof or by means of an adapted position of the placement head 110.

In addition to the above-described compensation of the angular position and/or of the offset of the component 180 relative to the suction pipette 112, in accordance with the method described here, during the placement of the component 180, a spatial offset between the LED chip 185 (first structural feature) and the geometrical center of the component connection structure 186 (second structural feature), which is not illustrated in FIG. 1, is additionally taken into account as well. Said offset can be compensated for during the placement of the component 180 in a simple manner by means of an adapted position of the placement head 110 within a movement plane of the placement head 110, wherein the movement plane is oriented parallel to the surface of the printed circuit board 175.

The steps described above with reference to FIGS. 1*a* to 1*g* for carrying out the method described in this document for optically measuring the structure of an electronic component 180 can be summarized illustratively as follows:

Before the actual placement operation, the component 180 is collected from a component feed unit and placed on a transparent plate of the measuring station 150 preferably exactly at the midpoint of the two cameras 120 and 160. The two cameras 120 and 160 then measure in each case the midpoints of the features visible to them. These are the LED chip 185 and the soldering connections 186. If the two midpoints deviate from one another in terms of their local position, then this is the offset between the LED chip 185 and the soldering connections 186 which is to be taken into account for later placement. Since, when the component 180 is collected again, a further offset of the component 180 with respect to the corresponding suction pipette 112 can arise, the component 180 to be placed is measured again by means of the component camera 130 fitted to the placement head 110 or alternatively by means of a component camera incorporated in a stationary fashion. The offset between the component 180 and the suction pipette 112 is then taken into account computationally with the offset between the LED chip 185 and the soldering connections 186, such that the center of the LED chip 185 is located exactly at a predefined and desired position on the printed circuit board 175.

For ascertaining the offset between the LED chip 185 (=first structural feature of the LED component 180) and the soldering connections 186 (=electrical component connections or second structural feature of the LED component 180), it is possible to use a pair of cameras 120, 160 whose optical axes coincide. In this case, it is not necessary to generate a relation of the midpoint measured by one camera with respect to the component 180 itself (e.g. its outer contour). Consequently, the measurement can always be carried out stably and in a constant manner even in the case of components having changing contours, surfaces, colors, etc., as long as the regions to be measured are clearly discernible. Even in the case of large components whose body projects beyond the field of view of the relevant camera 120, 160, a measurement is still possible as long as the structural feature to be measured lies within the field of view of the relevant camera. The offset measurement described can be carried out very accurately since ultimately it is dependent only on the resolution of the two cameras 120, 160. Possible errors as a result of the handling of the components (e.g. picking up, placing) at the measuring station 150 can be detected by an optical measurement of the component 180 by means of the optional component camera 130 and can be compensated for by means of a suitable driving of the placement head 110 (position of the placement head 110 and angular position of the relevant suction pipette 112).

Figure 2:
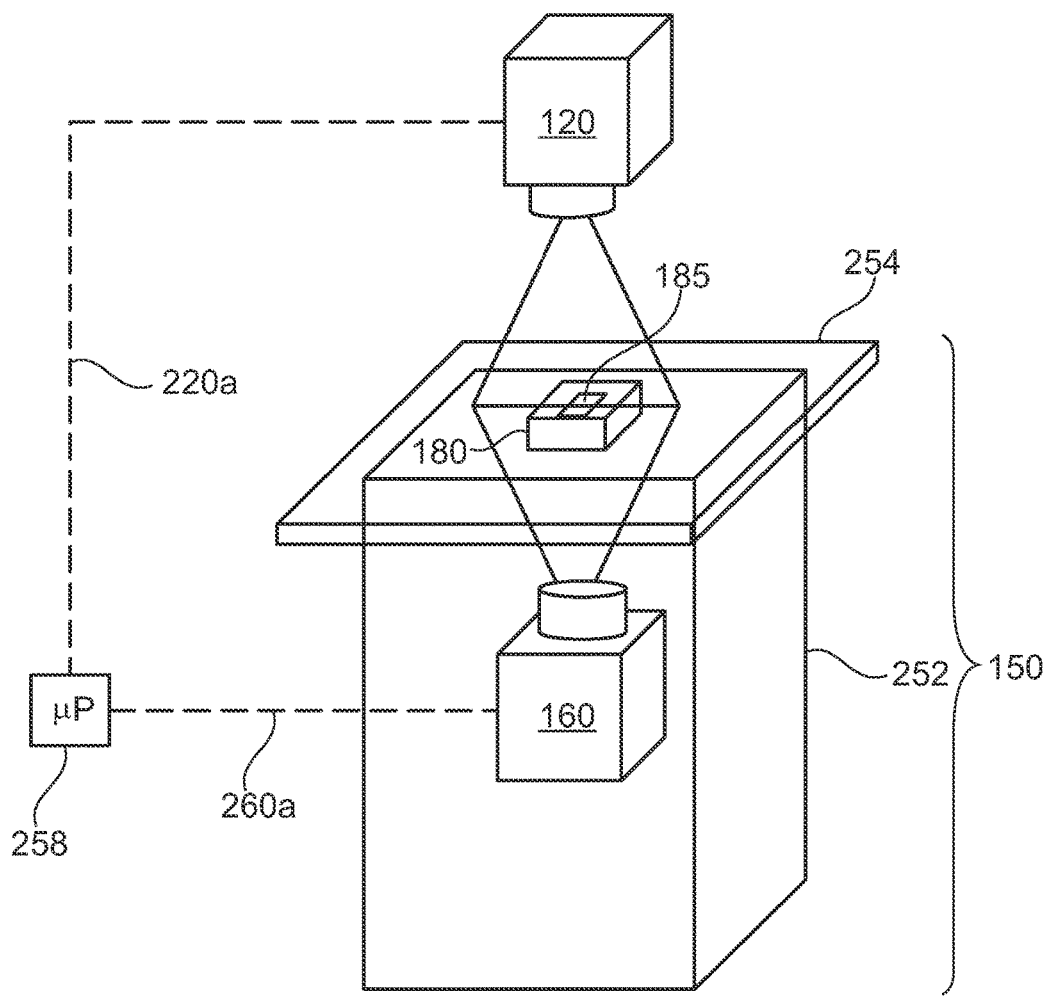
FIG. 2 shows a measuring station which, together with a movable camera fitted to a placement head, can carry out the optical measuring method in accordance with one exemplary embodiment of the invention.

FIG. 2 shows the measuring station 150 in an enlarged illustration. The measuring station has a housing 252, in which the second camera 160 is situated. At the top side of the housing 252, the measuring station 150 has an optically transparent bearing element 254, which was designated as transparent plate previously. For measuring the offset between (i) the first structural feature 185 (here the LED chip 185) situated at the top side of the component 180 and (ii) the second structural feature (here the soldering connections or the electrical connection structure of the component 180) situated at the underside of the component 180, the component 180 is placed onto the transparent bearing element 254, where it is then captured simultaneously (i) by the second camera 160 of the measuring station 150 and (ii) by the printed circuit board camera 120. By means of an evaluation device 258, which is connected via signal lines 260a and 220a to the second camera 160 and the first camera 120, respectively, the two images recorded by the two cameras 160 and 120 are evaluated and the spatial offset between the first structural feature 185 (LED chip) and the second structural feature (component connection structure) is ascertained therefrom.

Figure 3:
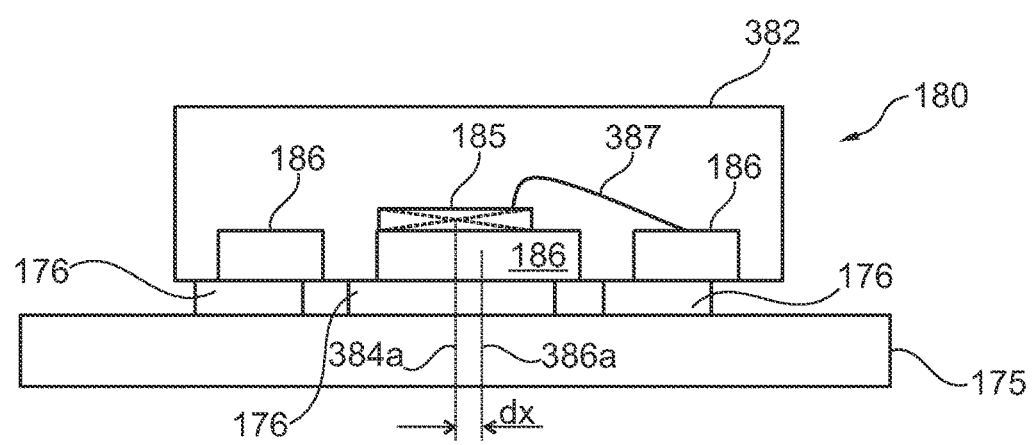
FIG. 3 shows an LED component with an offset between the geometrical center of the electrical connection structure and the geometrical center of the light emitting LED chip.

FIG. 3 shows an enlarged illustration of the LED component 180 placed onto the printed circuit board 175. The LED component 180 has a component housing 382, in which the LED chip 185 is situated. For contacting the LED chip 185, component connections 186 are embodied in the component housing 382, via which component connections the LED component 180 can be electrically conductively connected to connection pads 176 on the printed circuit board 175. As is evident from FIG. 3, a top side of the LED chip 185 is connected via a bonding wire 387 to the right component connection of the total of three component connections 186. The underside of the LED chip 185 is in direct contact with the central component connection of the three component connections 186. The left component connection of the three component connections 186 can likewise be connected to the top side of the LED chip 185. Alternatively, the left component connection 186 can also be connected to other component parts, for example to a further LED chip (not illustrated), of the LED component 180.

The geometrical center of the LED chip 185 is represented in FIG. 3 by a dashed line provided with the reference sign 384a. The geometrical center of the structure of the three component connections 186 is correspondingly represented by a dashed line provided with the reference sign 386a. The spatial offset between the LED chip 185 (first structural feature) and the component connections (second structural feature), defined for example by a leadframe of the LED component 180, is identified by "dx".

As explained in detail above, in the placement method described in this document, said offset dx is taken into account during the placement of the LED component 180, such that as a result the LED chip 185 is situated at an "optical" position which is optimal in relation to the printed circuit board 175.

It is pointed out that in practice between the two structural features there can be not only a spatial offset dx along an x-direction but also, of course, a spatial offset "dy" along a y-direction and an (undesired) rotation "dtheta" between the structure of the first structural feature and the structure of the second structural feature. It goes without saying that the deviations "dy" and/or "dtheta" can also be taken into account during the placement of the LED component 180 onto the component carrier 175.

REFERENCE SIGNS

100 Placement system
110 Placement head/turret head
112 Component holding devices/suction pipettes
120 First camera/printed circuit board camera
130 Further camera/component camera
150 Measuring station
160 Second camera
170 Feed belt
175 component carrier/printed circuit board
176 Connection pads
180 Electronic component/LED component
185 First structural feature/LED chip
186 Second structural feature/component connections
220a Signal line
252 Housing 254 Optically transparent bearing element
258 Evaluation device
260a Signal line
382 Component housing
384a Geometrical center of the LED chip
386a Geometrical center of component connections
387 Bonding wire
dx Offset

The invention claimed is:

1. Method for mounting an electronic component onto a component carrier, the method comprising optically capturing a first image from a first side of the component, at which first side a first structural feature of the component is discernible, by means of a first camera,
   optically capturing a second image from a second side of the component, at which second side a second structural feature of the component is discernible, by means of a second camera, wherein the first side and the second side are situated opposite one another and wherein the second structural feature is configured to be connected at a predetermined position on the component carrier,
   orienting the electronic component such that a center of the first structural feature is aligned with a desired position relative to the component carrier, wherein the second structural feature can be correspondingly offset from the predetermined position, and
   mounting the electronic component onto the component carrier, wherein the center of the first structural feature is aligned relative to the component carrier, wherein the second structural feature is offset from the predetermined position.

2. Method according to claim 1, further comprising measuring a spatial offset (dx) between the second structural feature and the first structural feature on the basis of the first image and the second image, in order to determine the correct spatial position of the first structural feature.

3. Method according to claim 2, wherein
   the spatial offset (dx) is determined in a plane which is oriented parallel in relation to the first side and/or in relation to the second side.

4. Method according to claim 1, wherein
   the first camera and the second camera have a fixed spatial relation with respect to one another.

5. Method according to claim 1, wherein
   a first optical axis of the first camera and a second optical axis of the second camera are aligned collinearly with respect to one another.

6. Method according to claim 1, wherein
   the first camera and/or the second camera are/is a camera movable within an automatic placement machine.

7. Method according to claim 1, wherein
   the component is situated in the same position during the capture of the first image and during the capture of the second image.

8. Method according to claim 7, wherein
   the first image and the second image are captured at different points in time.

9. Method according to claim 7, wherein
   the first image and the second image are captured simultaneously.

10. Method according to claim 1, wherein
    the component is situated in a first position during the capture of the first image and wherein
    the component is situated in a second position during the capture of the second image, wherein the first position is different than the second position.

11. Method according to claim 1, wherein
    the electronic component (180) is situated on an optically transparent bearing element (254) when at least one of the two images is optically captured.

12. Method according to claim 1, wherein
    the electronic component is held by a clamping device when at least one of the two images is optically captured.

13. Method according to claim 1, wherein
    a plurality of images of a plurality of components are recorded and thus optically captured by means of the first camera and/or by means of the second camera with a respective image recording, wherein an image is in each case assigned to a component,
    for each component of the plurality of components in each case a spatial offset between two structural features situated at different sides of the component is determined on the basis of the corresponding images of the component recorded from different directions,
    each of the plurality of components is oriented such that in each case a center of the first structural feature is aligned with a desired position relative to the component carrier, wherein the respective second structural feature can be correspondingly offset from the respective predetermined position, and
    mounting the plurality of components onto the component carrier, wherein the center of the respective first structural feature is aligned relative to the component carrier, wherein the respective second structural feature is offset from the respective predetermined position.

14. Method according to claim 1, wherein
    the electronic component is an optoelectronic component,
    the first structural feature is a light emitting chip or a light receiving chip of the optoelectronic component, and
    the second structural feature is at least one electrical connection of the optoelectronic component.

15. Method according to claim 1, wherein
    the first image is captured through a suction pipette.

16. Automatic placement machine for mounting an electronic component onto a component carrier, the automatic placement machine comprising
    a placement head
    (i) for picking up the electronic component,
    (ii) for transporting the picked-up electronic component over the component carrier and
    (iii) for placing the transported electronic component onto the component carrier,
    a first camera,
    a second camera and
    an evaluation device coupled to the two cameras, wherein the evaluation device is designed to cause the automatic placement machine to perform the method according to claim 1.

17. Method for checking the functionality of an optoelectronic component, the method comprising
    determining a spatial offset (dx) between
    (i) a second structural feature of the optoelectronic component, which is situated at a second side of the component, and
    (ii) a first structural feature of the optoelectronic component, which is situated at a first side of the component, wherein the first side and the second side are situated opposite one another,
    by means of a sub-method for optically measuring the structure of the optoelectronic component, wherein the sub-method comprises optically capturing a first image from the first side of the optoelectronic component by means of a first camera, optically capturing a second image from the second side of the component by means of a second camera, and determining the spatial offset (dx) on the basis of the first image and the second image, wherein the optoelectronic component is a light emitting optoelectronic component and wherein the method furthermore comprises contacting the light emitting optoelectronic component at an optically transparent carrier element, switching on the light emitting optoelectronic component contacted at the optically transparent carrier element, measuring an intensity of light which is emitted by the switched-on optoelectronic component, and checking the functionality of the optoelectronic component on the basis of the measured intensity.

18. Method according to claim 17, further comprising measuring a spatial distribution of the local luminance over a luminous area of the optoelectronic component.

* * * * *